(12) United States Patent
Nakai et al.

(10) Patent No.: US 6,717,160 B2
(45) Date of Patent: Apr. 6, 2004

(54) BEAM DIRECT-WRITING APPARATUS, IMAGING APPARATUS AND METHOD OF OBTAINING PREFERABLE PATH PASSING THROUGH POINTS

(75) Inventors: Kazuhiro Nakai, Kyoto (JP); Yoshihiko Onogawa, Kyoto (JP)

(73) Assignee: Dainippon Screen MFG. Co., Ltd., Kyoto (JP)

( * ) Notice: Subject to any disclaimer, the term of this patent is extended or adjusted under 35 U.S.C. 154(b) by 0 days.

(21) Appl. No.: 10/355,178

(22) Filed: Jan. 31, 2003

(65) Prior Publication Data

US 2003/0160191 A1 Aug. 28, 2003

(30) Foreign Application Priority Data

Feb. 22, 2002 (JP) .................... P2002-045756

(51) Int. Cl.[7] .................................. G21K 5/10
(52) U.S. Cl. ................................ 250/492.22
(58) Field of Search .................... 250/492.22

(56) References Cited

U.S. PATENT DOCUMENTS

2003/0160192 * 8/2003 Inanami et al. ........ 250/492.23

FOREIGN PATENT DOCUMENTS

JP 10211152 * 2/2000
JP 2001-195112 7/2001

* cited by examiner

*Primary Examiner*—John R. Lee
*Assistant Examiner*—James J. Leybourne
(74) *Attorney, Agent, or Firm*—McDermott, Will & Emery

(57) ABSTRACT

A beam direct-writing apparatus for writing a pattern on a semiconductor substrate is provided with a head part for emitting an electron beam for direct writing and a computer for performing a computation. A program is installed in the computer in advance to obtain a path passing through a plurality of writing points on the substrate. The program divides a region (6) dotted with writing points (60) into a plurality of divided regions on the basis of the density of the points contained therein and sets a passing order among a plurality of divided regions by using an algorithm for generating the Hilbert Curve. Subsequently, the program sets a path in each of the divided regions by using a path setting algorithm and subsequently connects the path in one divided region to the path in another divided region according to the passing order, to obtain a final path (74). This allows an efficient beam direct-writing on a substrate (9).

28 Claims, 11 Drawing Sheets

F/G. 2

FIG. 9
FIG. 9A
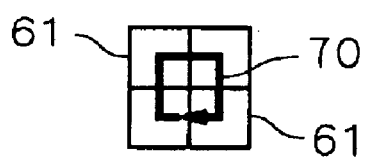
FIG. 9B
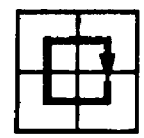
FIG. 9C
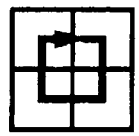
FIG. 9D
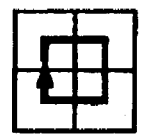

FIG. 10
FIG. 10A
FIG. 10G
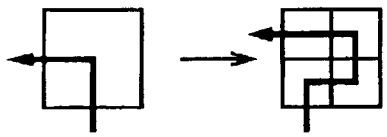
FIG. 10B
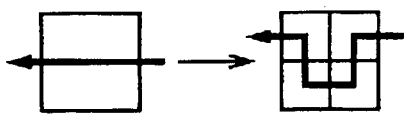
FIG. 10H
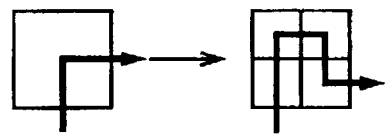
FIG. 10C
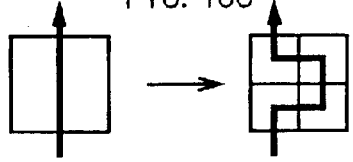
FIG. 10I
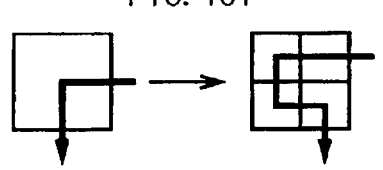
FIG. 10D
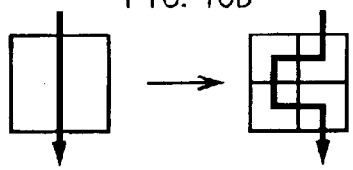
FIG. 10J
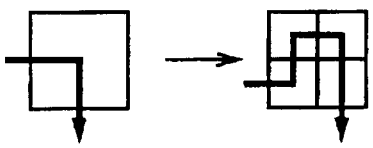
FIG. 10E
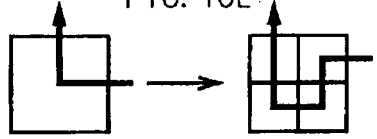
FIG. 10K
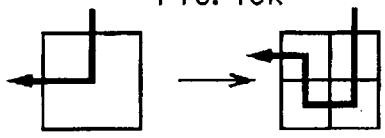
FIG. 10F
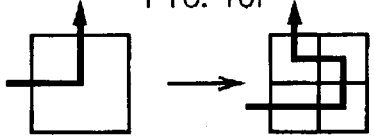
FIG. 10L
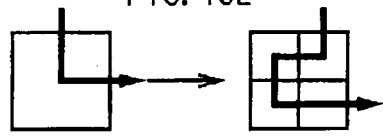

F/G. 11
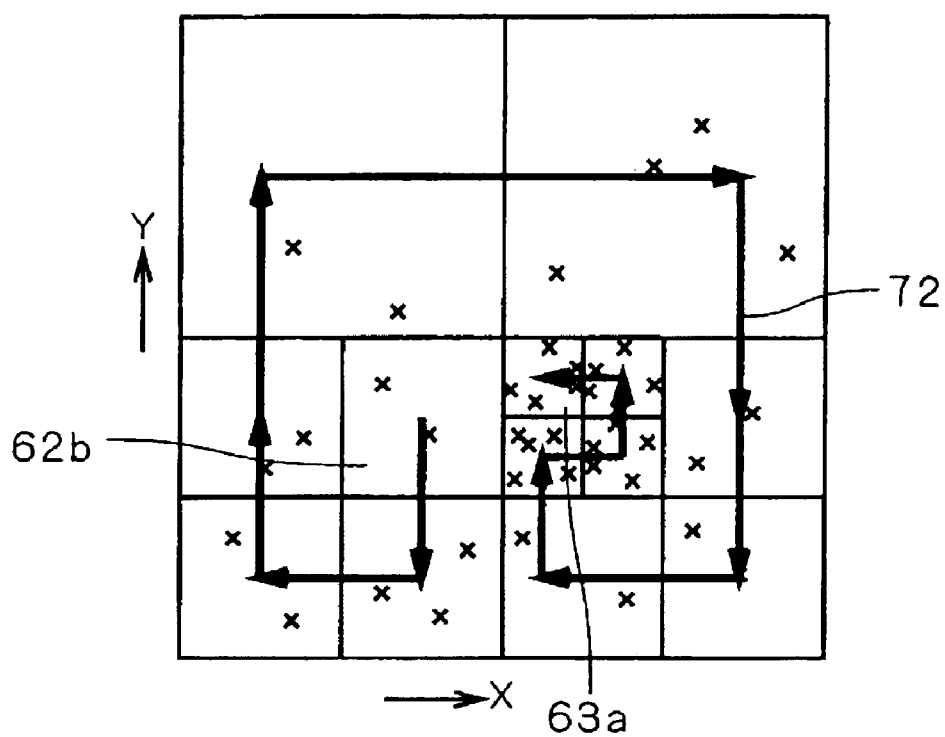

BEAM DIRECT-WRITING APPARATUS, IMAGING APPARATUS AND METHOD OF OBTAINING PREFERABLE PATH PASSING THROUGH POINTS

BACKGROUND OF THE INVENTION

1. Field of the Invention

The present invention relates to a technique to obtain a passing order of a plurality of points, and more particularly to a beam direct-writing apparatus for performing beam direct-writing on a plurality of writing points on a substrate by using an electron beam and a light beam and an imaging apparatus for acquiring images on a plurality of imaging positions on a substrate.

2. Description of the Background Art

In an beam direct-writing apparatus for writing a circuit pattern on a semiconductor substrate (hereinafter, referred to as "substrate") or an imaging apparatus for performing image pickup for inspection of a pattern and the like written on a substrate, a number of writing points or imaging positions (hereinafter, referred to generally as "target points") on the substrate are accessed. For example, in the beam direct-writing apparatus, by irradiating a number of target points on the substrate with an electron beam, a number of points (microscopic patterns) are written on the substrate. In this case, the time required for the writing increases almost proportionally to the distance of a path passing through the target points.

Conventionally, in most cases, the path passing through all the target points is set according to the input order of data of the target points or the ascending or descending order of X coordinate and Y coordinate of the target points by defining the X coordinate axis and the Y coordinate axis (so-called "XY sort") in advance.

Though the path can be quickly set by using a computer or the like according to the XY sort whose algorithm is simple, however, if the target points are scattered in a wide range, the obtained path disadvantageously becomes very long.

Though many methods of obtaining a path as short as possible with a complicate computational algorithm have been studied, these methods, for actual use, need the computation time which becomes exponentially longer as the number of target points increases and an expensive arithmetic circuit.

Such a method as disclosed in Japanese Patent Application Laid Open Gazette No. 2001-195112 is proposed, where the size of one divided region is determined in advance through a plurality of simulations of equally dividing a region containing target points and a path is set for each divided region by using a complicate algorithm. In this method, however, the time for the simulations is needed and when the target points are locally concentrated, the whole region is divided into unnecessarily small regions on the basis of the region where the target points are concentrated and this makes it impossible to obtain a preferable path.

SUMMARY OF THE INVENTION

It is an object of the present invention to easily obtain a preferable path.

The present invention is intended for a beam direct-writing apparatus for performing beam direct-writing on a substrate.

According to an aspect of the present invention, the beam direct-writing apparatus comprises a beam emission part for emitting a direct-writing beam onto the substrate, a deflection part for deflecting the beam, a holding part for holding the substrate, and a path setting part for obtaining a path passing through a plurality of writing points on the substrate, and in the beam direct-writing apparatus, the path setting part executes a region dividing step for dividing a two-dimensional writing region into a plurality of divided regions so that a divided region is smaller as density of writing points contained in said divided region is higher, a region passing order setting step for setting a region passing order which is an order for the path to pass through the plurality of divided regions, a writing point setting step for setting a first writing point and a second writing point for each of the plurality of divided regions on the basis of the region passing order, a sectional path setting step for obtaining a sectional path passing through points from the first writing point to the second writing point in each of the plurality of divided regions by using a predetermined path setting algorithm, and a sectional path connecting step for connecting the second writing point in each of the plurality of divided regions to the first writing point in the next divided region according to the region passing order.

The beam direct-writing apparatus makes it possible to easily obtain a preferable path passing through a plurality of writing points.

Preferably, the region dividing step comprises a simple division step for dividing the writing region into a predetermined number of divided regions which have almost the same size, and a recursive execution step for recursively executing the simple division step for one out of the predetermined number of divided regions which is selected on the basis of density of the plurality of writing points, and further preferably, a region passing order among divided regions which are obtained in the first execution of the simple division step is determined in advance, region passing orders among divided regions which are obtained in the second and subsequent executions of the simple division step are determined in advance on the basis of passing manners of a divided region before division, and the region dividing step and the region passing order setting step are executed substantially at the same time.

This makes it possible to obtain a path for a short time.

According to a preferred embodiment, the region passing orders among the divided regions which are obtained in the second and subsequent executions of the simple division step are determined in advance by using a fractal curve generation algorithm.

The present invention allows the starting point and the terminal point of a path to be close to each other by making the region passing order among the divided regions obtained in the first execution of the simple division step in a loop.

The present invention is also intended for a technique to obtain a path passing through a plurality of imaging positions in an imaging apparatus for performing image pickup of a substrate, and further intended for a computer-readable medium carrying a program which causes a computer to obtain a preferable path passing through a plurality of points, and a method of obtaining a preferable path in a various technical fields.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 9A to 9D are views showing a passing order among divided regions which are first obtained;

FIGS. 10A to 10L are views showing a manner of obtaining the passing order among the divided regions which are obtained in the second and subsequent times;

FIG. 11 is a view showing the passing order among the divided regions;

DESCRIPTION OF THE PREFERRED EMBODIMENTS

Figure 1:
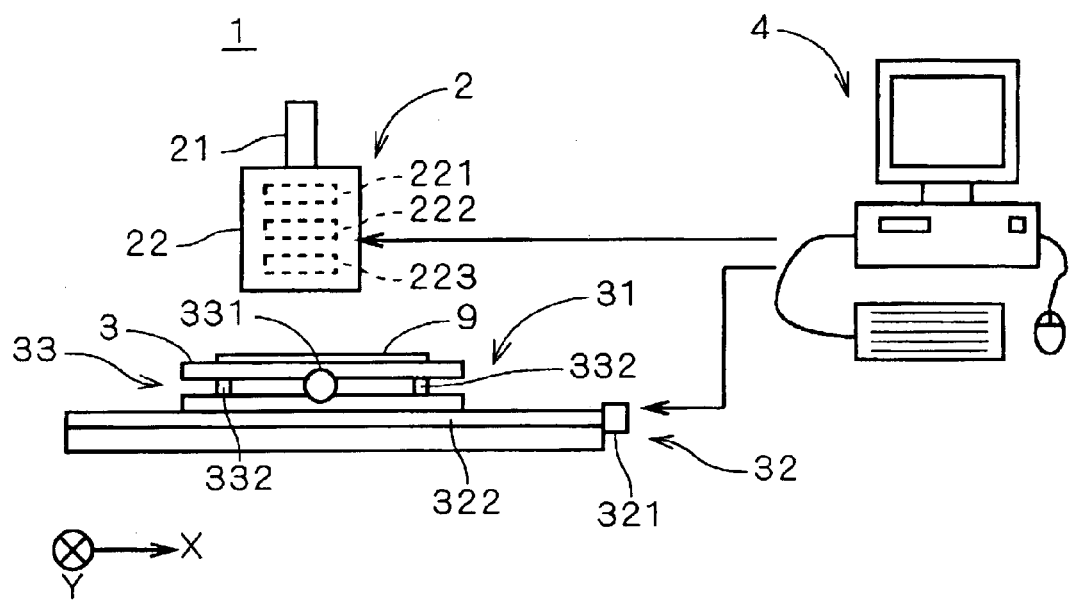
FIG. 1 is a view showing an overall structure of a beam direct-writing apparatus.

FIG. 1 is a view showing an overall structure of a beam direct-writing apparatus 1 in accordance with a first preferred embodiment of the present invention. The beam direct-writing apparatus 1 has a head part 2 for emitting an electron beam used for performing beam direct-writing on a substrate 9, a stage 3 for supporting the substrate 9, a stage driving part 31 for transferring the stage 3 relatively to the head part 2 and a computer 4 connected to the head part 2 and the stage driving part 31.

The head part 2 has a beam emission part 21 for generating the electron beam and an optical unit 22 for appropriately guiding the electron beam to the substrate 9. The optical unit 22 has a beam shaping part 221 for shaping the electron beam, a deflection part 222 for deflecting the electron beam and an objective lens part 223 for converging the electron beam and guiding it to the substrate 9.

The electron beam emitted from the beam emission part 21 is deflected and shaped into a desired beam shape by a plurality of apertures in the beam shaping part 221, and further deflected for the purpose of main scan (scan across regions on the substrate 9) and subscan (scan in a region) in the deflection part 222. After that, the electron beam is converged on the substrate 9 by the objective lens part 223 and beam direct-writing is performed on the substrate 9. The layout of the beam shaping part 221, the deflection part 222 and the objective lens part 223 are not limited to the above-discussed case, and the order and partial layout of the constituent elements may be changed as appropriate. A sub-subscan for scanning further divided regions may be performed.

The stage driving part 31 has an X-direction transfer mechanism 32 for transferring the stage 3 in the X direction of FIG. 1 and a Y-direction transfer mechanism 33 for transferring the same in the Y direction. In the X-direction transfer mechanism 32, a ball screw (not shown) is connected to a motor 321 and through rotation of the motor 321, the Y-direction transfer mechanism 33 is transferred in the X direction along guide rails 322. The Y-direction transfer mechanism 33 has the same constitution as the X-direction transfer mechanism 32 and through rotation of a motor 331, the stage 3 is transferred by a ball screw (not shown) in the Y direction along guide rails 332.

Figure 2:
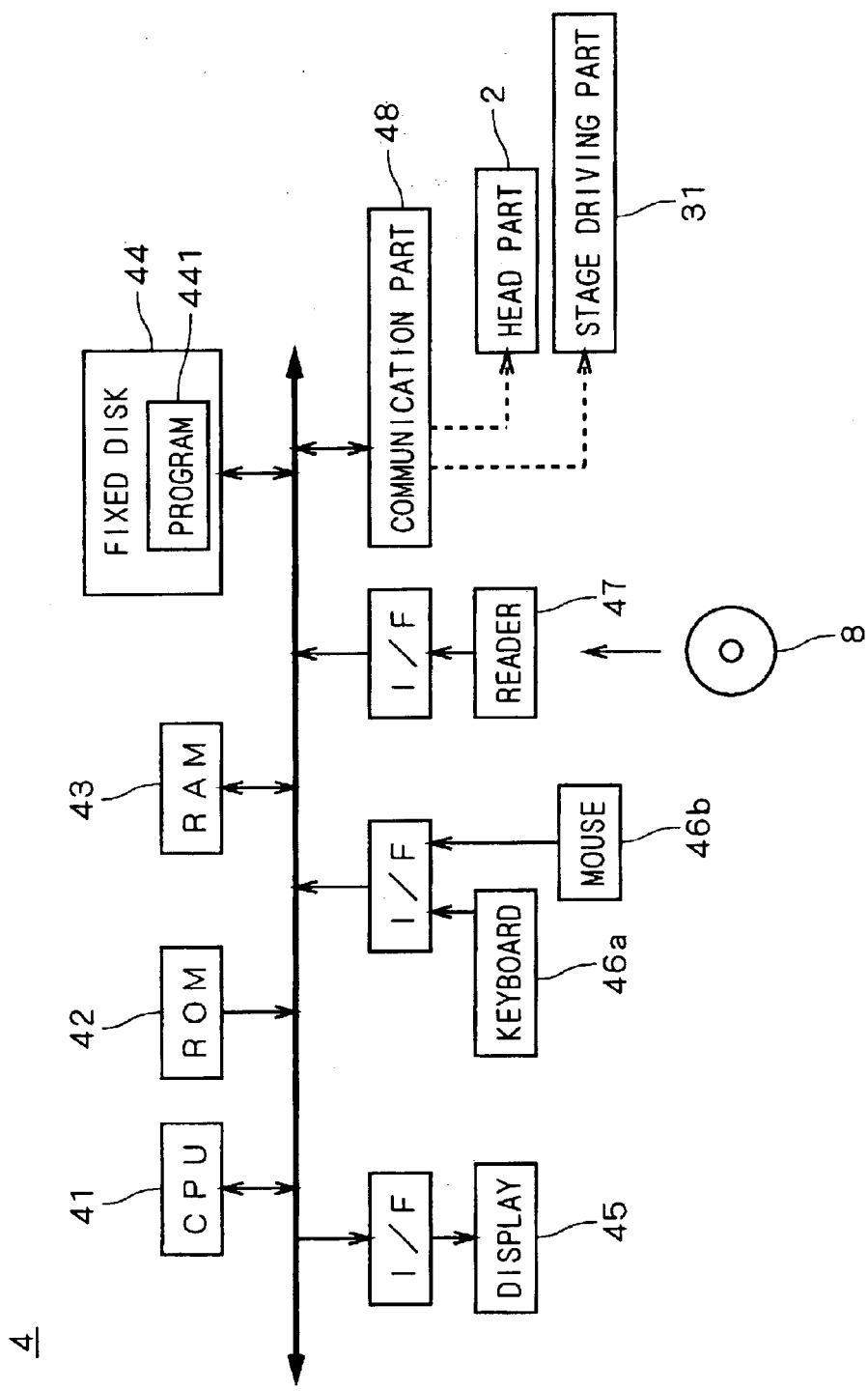
FIG. 2 is a view showing a constitution of a computer.

The computer 4 has a general structure of computer system, as shown in FIG. 2, where a CPU 41 for performing various computations, a ROM 42 for storing a basic program and a RAM 43 for storing various information are connected to a bus line. To the bus line connected are a fixed disk 44 for storing information, a display 45 for displaying various information, a keyboard 46a and a mouse 46b for receiving inputs from an operator, a reader 47 for reading information out from a computer-readable recording medium 8, such as an optical disk, a magnetic disk and a magneto-optic disk, and a communication part 48 for sending a control signal to the head part 2 and the stage driving part 31, through an interface (I/F) or the like, as appropriate.

A program 441 is read out from the recording medium 8 through the reader 47 to the computer 4 in advance and stored in the fixed disk 44. Then, the program 441 is copied to the RAM 43 and the CPU 41 executes the computation according to the program in the RAM 43 (in other words, the computer executes the program), and thus the computer 4 controls the constituent elements to perform a beam direct-writing.

Figure 3:
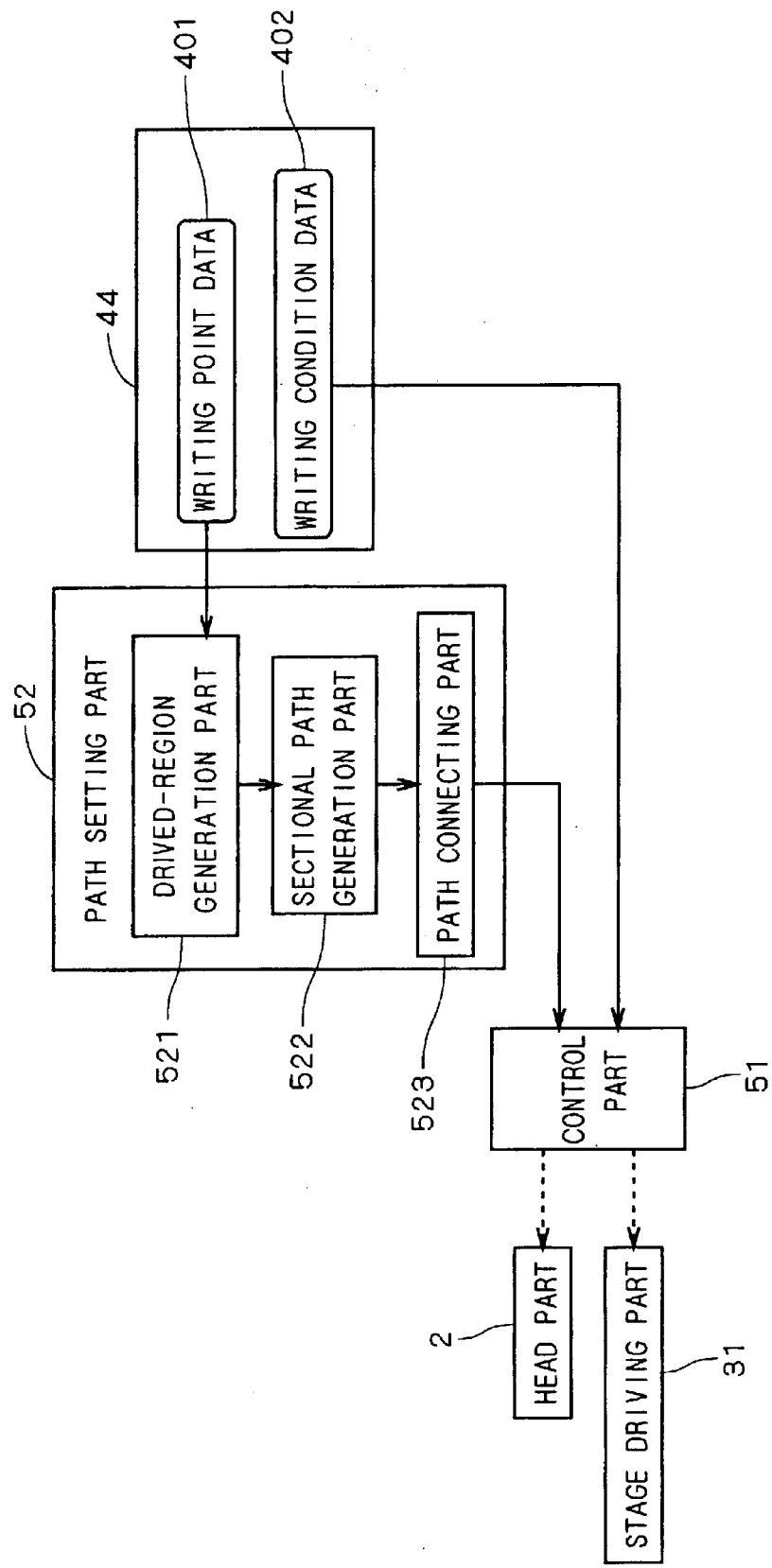
FIG. 3 is a block diagram showing a functional structure of the computer.

FIG. 3 is a block diagram showing a functional structure implemented by the CPU 41, the ROM 42, the RAM 43, the fixed disk 44 and the like, through operation of the CPU 41 according to the program 441. FIG. 3 shows functions of a control part 51 and a path setting part 52 implemented by the CPU 41 and the like. These functions may be implemented by dedicated electric circuits, or may be partially implemented by the electric circuits.

When the beam direct-writing apparatus 1 performs beam direct-writing, writing point data 401 indicating positions of a plurality of writing points and writing condition data 402 indicating writing conditions such as size and shape of the beam are stored into the fixed disk 44 in advance by the operator through the keyboard 46a, the reader 47 and the like. The writing point data 401 is coordinate data with parameters of coordinates in the X and Y directions of FIG. 1 (coordinates relative to a predetermined reference point). The writing point data 401 is transferred from the fixed disk 44 to the path setting part 52 and processed by constituent elements of the path setting part 52 which are discussed later, and a passing order of the writing points are thereby obtained and transferred to the control part 51.

The control part 51 controls the stage driving part 31 to transfer a portion which corresponds to one semiconductor chip on the substrate 9 to a position immediately below the head part 2, and controls the head part 2 according to the passing order of the writing points and the writing condition data 402 to perform a writing in a predetermined region of the semiconductor chip.

Figure 4:
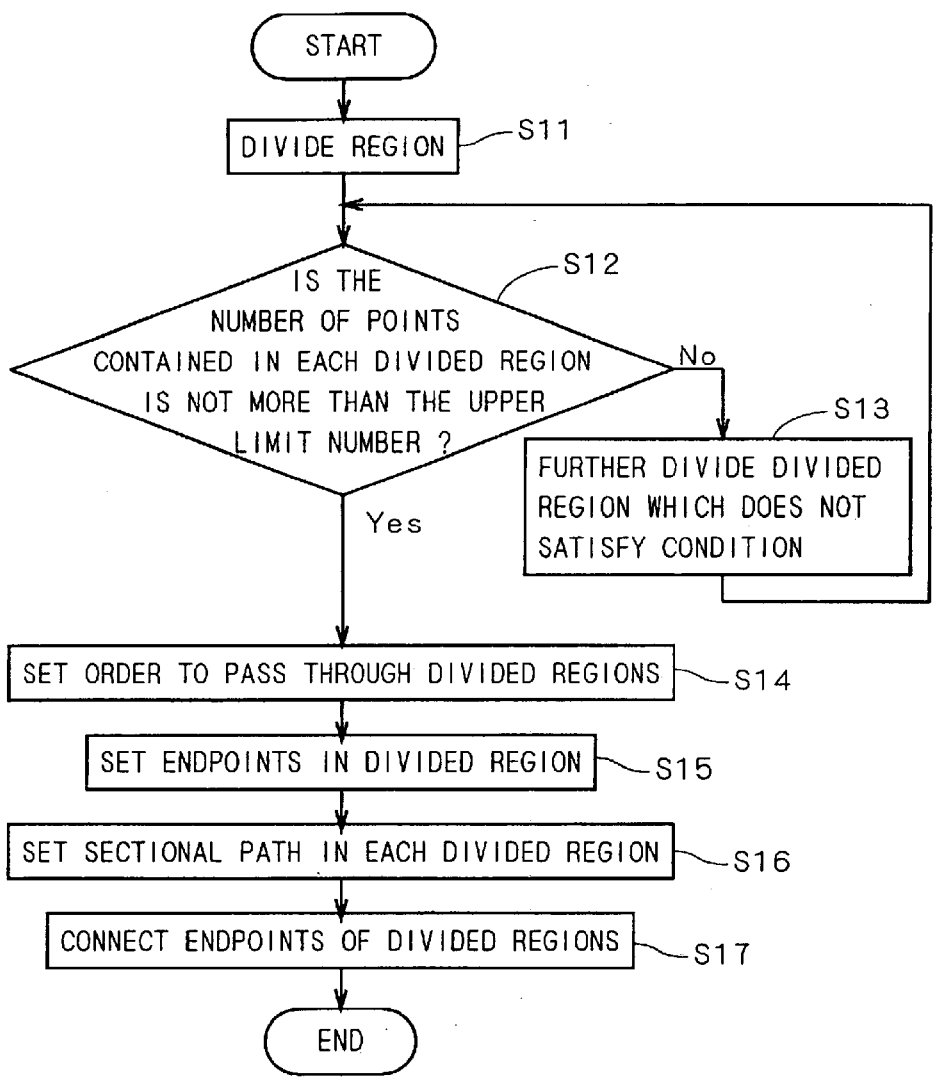
FIG. 4 is a flowchart showing an operation flow for obtaining a path passing through a plurality of writing points.

FIG. 4 is a flowchart showing an operation flow of the path setting part 52 for setting a path which is a passing order (writing order) of the writing points in the predetermined region on the substrate 9. The operation for setting the path will be discussed below along the flowchart of FIG. 4, referring to FIG. 3.

Figure 5:
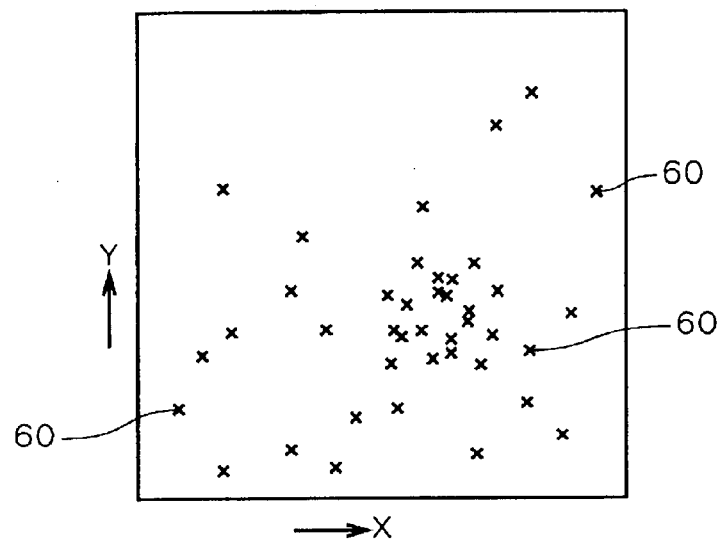
FIG. 5 is a view showing a region dotted with the writing points.
Figure 6:
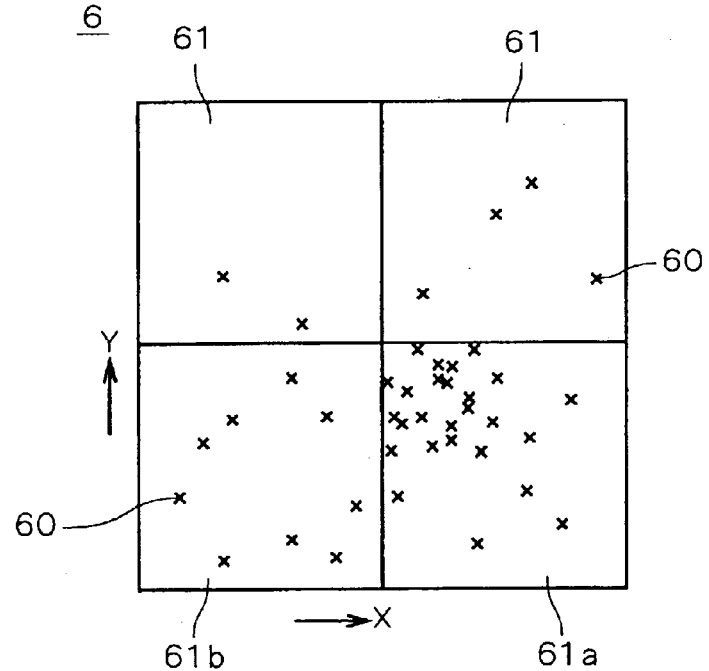
FIGS. 6 to 8 are views showing division of the region.

First, a divided-region generation part 521 in the path setting part 52 receives the writing point data 401 stored in the fixed disk 44 and simply divides a predetermined region on the substrate 9 which contains the writing points into a predetermined number of divided regions which have almost the same size (Step S11). When writing points 60 are present in a two-dimensional region 6 which is defined by the X and Y coordinates as shown in FIG. 5, for example, the region 6 is divided into four divided regions, being divided into two in each of the X and Y directions. FIG. 6 is a view illustrating divided regions 61 which are thus obtained. In FIG. 6, reference sign 61a is given to the divided region 61 on the right lower side ((+X) and (−Y) side) and reference sign 61b is given to the divided region 61 on the left lower side ((−X) and (−Y) side).

Figure 7:
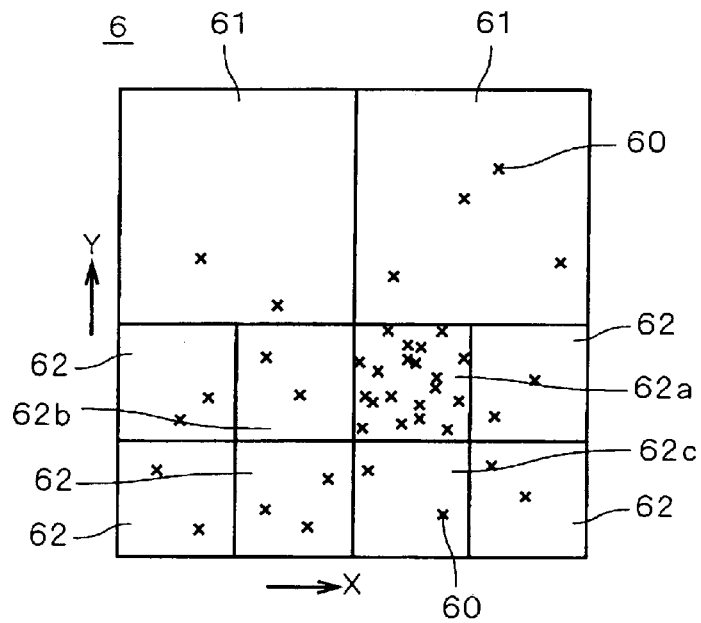

Subsequently, the divided-region generation part 521 counts the number of writing points 60 in each divided region and further equally divides the divided region which contains writing points 60 over the predetermined upper limit number into two in the X and Y directions (in other words, simply divides the divided region into four rectangular divided regions) (Steps S12 and S13). In FIG. 6, when the upper limit number of points is five, each of the divided regions 61a and 61b which contain the writing points over five is equally divided into four divided regions 62 as shown in FIG. 7. In FIG. 7, reference sign 62a is given to the divided region 62 which is obtained by dividing the divided region 61a (see FIG. 6) and positioned on the left upper side ((−X) and (+Y) side) and reference signs 62b and 62c are given to the divided regions 62 which are positioned on the left side and on the lower side of the divided region 62a, respectively.

Figure 8:
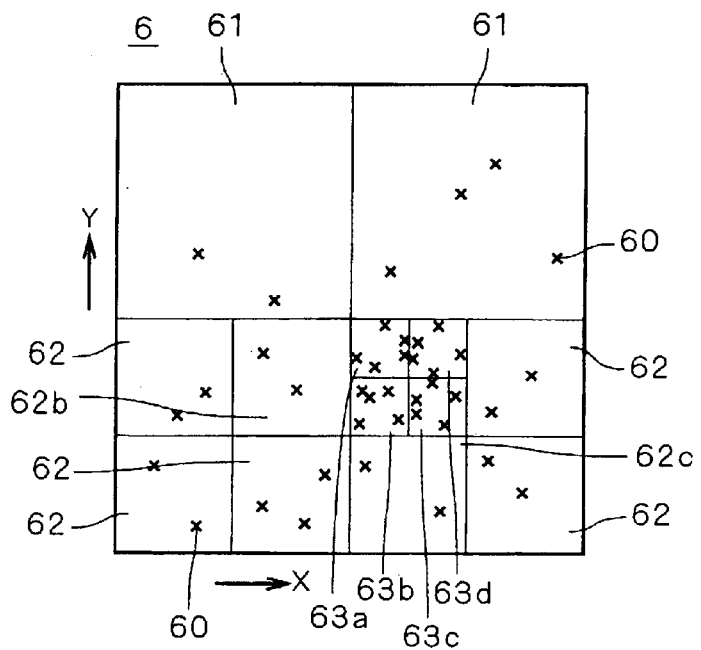

In an actual computation, Steps S12 and S13, which are executed for each divided region generated by division, are recursively executed until the number of writing points 60 in each divided region becomes not more than the upper limit number. In the case of FIG. 7, since writing points 60 over the upper limit number are present in the divided region 62a, the divided region 62a is further equally divided into four divided regions 63 (reference signs 63a, 63b, 63c and 63d are given to the respective divided regions from the left upper one in a counterclockwise direction) as shown in FIG. 8. Since the number of writing points 60 in each divided region becomes not more than the upper limit number, the division is finished (Step S12) and the divided regions 61 to 63 are finally set.

Next, a passing order of the electron beam among the divided regions 61 to 63 which are generated by the divided-region generation part 521 (a passing order among the divided regions passed by a finally obtained path passing through the writing points 60) is set (Step S14). The passing order among the divided regions may be set by any method but in the first preferred embodiment, the passing order is set by using the Hilbert Curve generation algorithm (hereinafter, abbreviated as "using the Hilbert Curve" as appropriate) which is suitable for setting the passing order among the rectangular divided regions.

When the Hilbert Curve is used, since the passing order among the divided regions is set on the basis of the sequence of divisions, it is preferable to execute Step S14 simultaneously with Steps S12 and S13. Though Step S14 is executed independently in the operation flow of FIG. 4, for convenience of illustration, the beam direct-writing apparatus 1 of the first preferred embodiment executes Step S14 substantially in parallel with Steps S12 and S13. Discussion will be made below on setting of the passing order among the divided regions performed by using the Hilbert Curve simultaneously with the division.

First, in Step S11, for the divided regions 61 which are obtained first, a passing order 70 in a loop passing all the divided regions 61 is set as shown in FIG. 9A. In this case, four passing orders as shown in FIGS. 9A to 9D, respectively, are possible, depending on which one of the divided regions 61 is the first of the passing order, and any one of the passing orders may be adopted in accordance with the specification of the apparatus and the substrate.

FIGS. 10A to 10L show that in further division of one divided region into four divided regions (i.e., the second and subsequent divisions), the passing orders among the divided regions according to conversion patterns using the Hilbert Curve are determined in advance on the basis of the passing manners for the divided region before this division. In other words, when the passing order between the adjacent divided regions is as shown in the left view of each figure, the passing order after the division is as shown in the right view thereof.

For example, the relation of passing order between the divided region 61b and the adjacent divided regions 61 is as shown in the left view of FIG. 10E and after the divided region 61b is equally divided into four as shown in FIG. 7, the passing order among the four generated divided regions 62 is as shown in the right view of FIG. 10E.

Similarly, with respect to the divided region 61a of FIG. 6, the conversion shown in FIG. 10K is applied to the four divided regions 62 (see FIG. 7). Since the divided region 62a of FIG. 7 corresponds to the left upper one of the four regions in the right view of FIG. 10K, the relation of passing order between the divided region 62a and the adjacent divided regions is as shown in the left view of FIG. 10G. Accordingly, when the divided region 62a is further divided, the conversion of FIG. 10G is applied.

In the beam direct-writing apparatus 1, by determining the conversion types shown in FIGS. 10A to 10L using the Hilbert Curve in advance as above, the passing order among the divided regions is set substantially in parallel with the division. FIG. 11 is a view showing a passing order 72 among the divided regions obtained substantially in parallel with the division in the region 6 shown in FIG. 5. In the passing order among the divided regions shown in FIG. 11, the first (i.e., the starting region) is the divided region 62b and the last (i.e., the end region) is the divided region 63a.

After the passing order among the divided regions is set, data indicating the divided regions 61 to 63, the passing order among the divided regions and the positions of the writing points 60 are transmitted to a sectional path generation part 522. The sectional path generation part 522 sets the first writing point and the second writing point (which is the last writing point in a divided region) in each divided region on the basis of the passing order among the divided regions. One of the writing points which is adjacent to a side touching the preceding divided region in the passing order is set as the first writing point and one of the writing points which is adjacent to a side touching the subsequent divided region in the passing order is set as the second writing point (Step S15). The first and second writing points are used as endpoints of the path in one divided region which is obtained in the next step.

In the first divided region of the passing order, one of the writing points 60 which is adjacent to a side touching the last divided region of the passing order is set as the first writing point, and in the last divided region of the passing order, one of the writing points 60 which is adjacent to a side touching the first divided region of the passing order is set as the second writing point.

Figure 12:
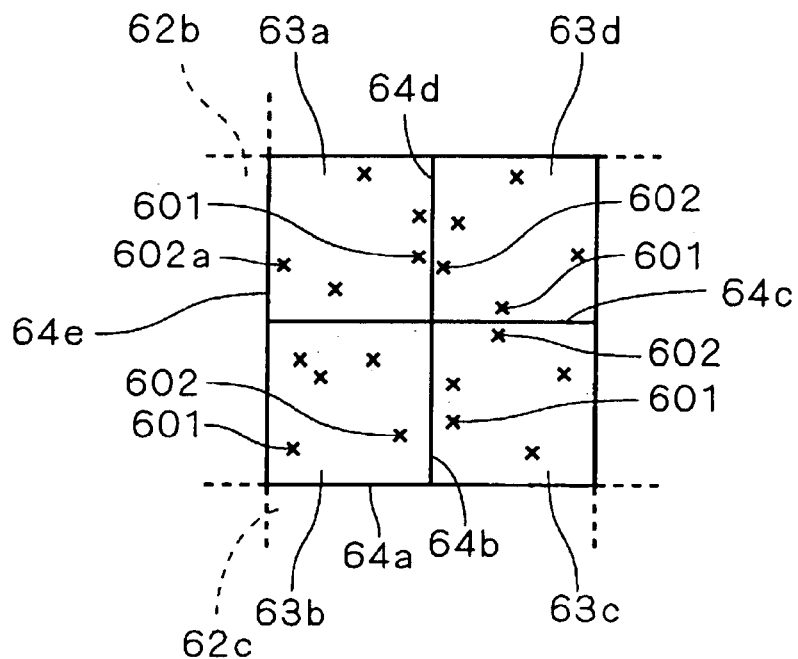
FIGS. 12 and 13 are views showing a manner of obtaining the path.

FIG. 12 is a view showing a manner of setting the first and second writing points (endpoints) of the divided regions 63a to 63d in FIG. 11 as an example. In FIG. 12, the passing order among the divided regions is 63b, 63c, 63d and 63a (see FIGS. 8 and 11). In the divided region 63b, one of the writing points 60 which is adjacent to a side 64*a* touching the preceding divided region 62*c* in the passing order is set as a first writing point 601, and one of the writing points 60 which is adjacent to a side 64*b* touching the subsequent divided region 63*c* in the passing order is set as a second writing point 602.

Similarly, in the divided region 63*c*, one of the writing points 60 which is adjacent to the side 64*b* is set as the first writing point 601, and one of the writing points 60 which is adjacent to a side 64*c* touching the subsequent divided region 63*d* in the passing order is set as the second writing point 602, and in the divided region 63*d*, one of the writing points 60 which is adjacent to the side 64*c* is set as the first writing point 601, and one of the writing points 60 which is adjacent to a side 64*d* touching the subsequent divided region 63*a* in the passing order is set as the second writing point 602.

In the last divided region 63*a* of the passing order among the divided regions, one of the writing points 60 which is adjacent to the side 64*d* is set as the first writing point 601, and one of the writing points 60 which is adjacent to a side 64*e* touching the first divided region 62*b* in the passing order is set as a second writing point 602*a*. Also in the divided regions 61 and 62 of FIG. 11, the first and second writing points 601 and 602 are similarly set, and in the first divided region 62*b* of the passing order, one of the writing points 60 which is adjacent to a side touching the last divided region 63*a* in the passing order is set as the first writing point 601.

When the first writing point 601 and the second writing point 602 are the same point in one divided region, another first writing point 601 and another second writing point 602 of the second candidate are obtained and either the first writing point 601 or the second writing point 602 are changed to the second candidate.

Figure 13:
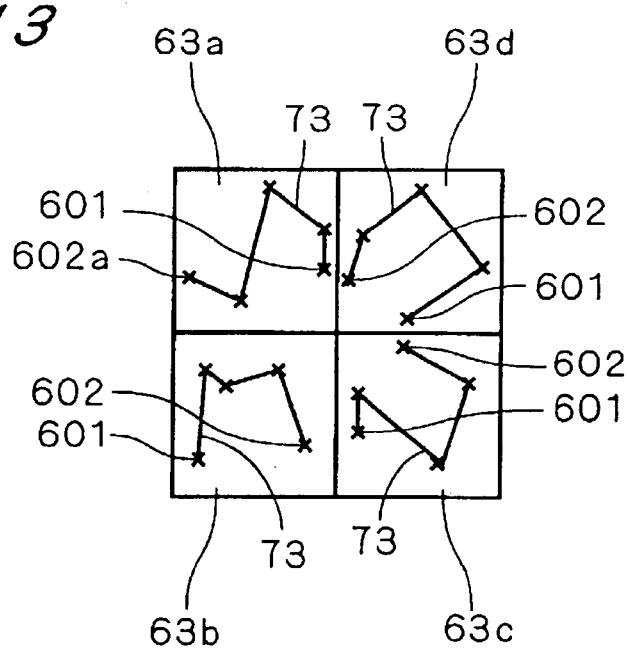

Subsequently, the sectional path generation part 522 sets a path passing the writing points 60 from the first writing point 601 to the second writing point 602 in each divided region by using a predetermined path setting algorithm (Step S16). In other words, a path in one divided region with the first writing point 601 and the second writing point 602 as the endpoints (hereinafter, referred to as "sectional path") is set. As the path setting algorithm, for example, a local search method is used. FIG. 13 shows sectional paths 73 in the divided regions 63*a* to 63*d* which are set by the local search method.

When an algorithm of obtaining the optimum path by repeating the setting of the endpoints and the setting of the sectional path is adopted, above Steps S15 and S16 are executed substantially in parallel with each other. In this case, none of the first writing point 601 and the second writing point 602 may be the point nearest to the above corresponding side (the side touching the preceding or subsequent divided region).

After that, a path connecting part 523 connects the second writing point 602 in each divided region to the first writing point 601 in the next divided region according to the passing order among the divided regions (Step S17), and a whole path in the region 6 is thereby set. Since the first writing point of the first divided region 62*b* in the passing order is a starting point of the whole path and the second writing point of the last divided region 63*a* is a terminal point, these two writing points are not connected with each other.

Figure 14:
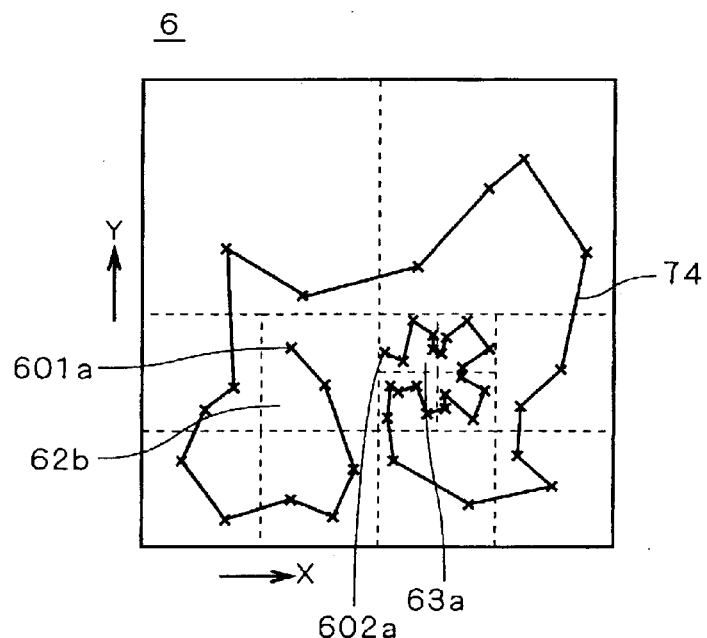
FIG. 14 is a view showing an example of obtained path.

FIG. 14 is a view showing a path 74 which is obtained as above, and the path 74 is a path from a first writing point 601*a* of the divided region 62*b* to the second writing point 602*a* of the divided region 63*a*. The generated path 74 is outputted to the control part 51 and used for controlling the head part 2 as discussed above.

Further, the beam direct-writing apparatus 1, which has been discussed above, can reduce the number of writing points 60 contained in each divided region while avoiding unnecessary division of regions by selecting a divided region with high density of writing points 60 and recursively dividing the selected divided region into smaller divided regions. Then, the passing order among the divided regions is quickly set by using the Hilbert Curve generation algorithm almost simultaneously with the division, and further the respective sectional paths for the divided regions 61 to 63 are set and these sectional paths are connected, to obtain the whole path 74. As a result, the path can be obtained quickly and easily.

In other words, when the whole path of the region 6 is obtained by a high-level algorithm, since the number of computations exponentially increases as the number of writing points increases, it is impossible to obtain the path for a short time. In the beam direct-writing apparatus 1, however, since the path is set for the divided regions 61 to 63 which contain the writing points 60 not more than the upper limit number, it is possible to reduce the number of computations on the whole. Further, the above method for dividing the regions, which needs no simulation for determining the size of the divided region in advance, is effective particularly in the flexible manufacturing system (where the volume of production is low and there are a wide variety of products).

Recursive executions of division of the regions (i.e., recursive calls of functions or generations of objects in a program) allow an increase in speed of computation and achieve setting of the path for a short time.

In the beam direct-writing apparatus 1, since the passing order in a loop is given to the divided regions 61 which are first obtained, the first divided region and the last divided region in the passing order are necessarily adjacent to each other in the final group of divided regions. In other words, the passing order among the divided regions which is finally obtained is almost in a loop and the starting point and the terminal point of the path are made close to each other.

This reduces the deflection for the subscan (scan in the region 6) when the beam direct-writing is finished on one region 6 and main scan (scan across a plurality of regions 6) of electron beam is performed to start the beam direct-writing on the next region 6. As a result, it is possible to suppress mutual influences between the controls of the main scan and the subscan and control the subscan needing high-precision positioning for a short time.

Usually, the accuracy of written image is deteriorated as the electron beam is deflected in a larger range to move (jump) the irradiation position by longer distance. For this reason, in such a case, measures to keep the accuracy, such as insertion of dummy data, are taken. In the beam direct-writing apparatus 1, since the large jumps in the region 6 are reduced by the division of the regions and the deflection of the subscan is suppressed into small one also in the jump among the regions 6, it is possible to achieve a quick and high-accuracy writing.

Assuming that no writing point 60 is present in the right upper divided region 61 (on the (+X) and (+Y) side) in FIG. 6, there is a possibility that a large deflection is need in the transfer from the left upper divided region 61 to the right lower divided region 61*a*. In this case, the amount of deflection of the electron beam can be suppressed by setting the passing order among the divided regions 61 which are first obtained as shown in FIG. 9B.

Figure 15:
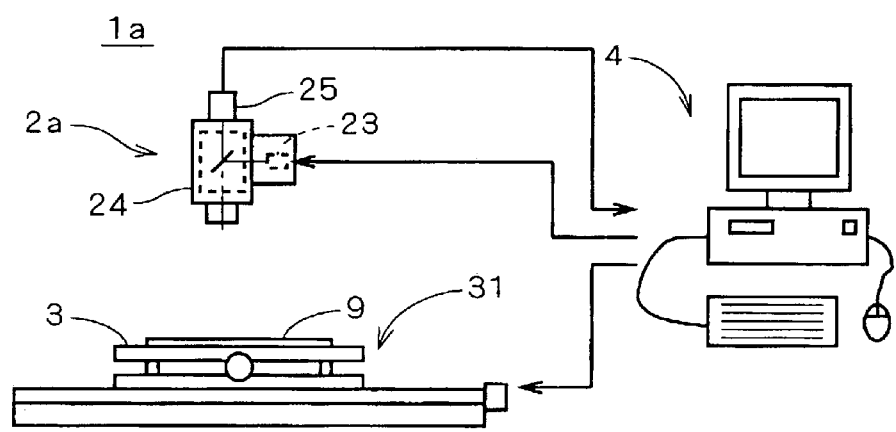
FIG. 15 is a view showing an overall structure of an imaging apparatus.

FIG. 15 is a view showing an overall structure of an imaging apparatus 1a in accordance with a second preferred embodiment of the present invention. The imaging apparatus 1a has an image pickup part 2a for picking up a two-dimensional image by imaging the substrate 9, the stage 3 for supporting the substrate 9, the stage driving part 31 for transferring the stage 3 relatively to the image pickup part 2a and the computer 4 connected to the image pickup part 2a and the stage driving part 31. The imaging apparatus 1a has the same basic constitution as the beam direct-writing apparatus 1 of the first preferred embodiment and further has the image pickup part 2a instead of the head part 2 of the beam direct-writing apparatus 1. The same reference signs are given to the corresponding elements. The functional structure of the computer 4 is the same as shown in FIG. 3.

The image pickup part 2a has a lighting part 23 for emitting illumination light, an optical system 24 which guides the illumination light to the substrate 9 and receives light from the substrate 9 and an image pickup device 25 for converting an image of the substrate 9 which is formed by the optical system 24 into an electrical signal.

In the imaging apparatus 1a, imaging position data indicating the coordinate of an imaging position on the substrate 9 is inputted instead of the writing point data 401 (see FIG. 3) discussed in the first preferred embodiment. The imaging position data is processed by the constituent elements of the path setting part 52 and then a set path which is a passing order among a plurality of imaging positions is transmitted to the control part 51. The control part 51 controls the stage driving part 31 so that a plurality of imaging positions are sequentially positioned immediately below the image pickup part 2a in accordance with the set path, and the image pickup part 2a subsequently acquires images at a plurality of imaging positions. The acquired image data are stored into the fixed disk 44.

An operation of the path setting part 52 for setting the path passing through a plurality of imaging positions is the same as that in the first preferred embodiment. Specifically, the imaging positions are processed instead of the writing points in the discussion with reference to FIG. 4. A preferable (short) path passing through the imaging positions is thereby obtained and an efficient image pickup is achieved.

Though the substrate 9 is an object in the beam direct-writing apparatus 1 and the imaging apparatus 1a, in general, there are many cases where the writing points or the imaging positions are unevenly distributed, being locally concentrated, in a semiconductor substrate, a printed circuit board, a mask substrate and the like. Therefore, by finely dividing the locally concentrated regions in generation of the divided regions, it is possible to so effectively obtain the path. In other words, the beam direct-writing apparatus 1 and the imaging apparatus 1a are especially suitable for a substrate on which circuits are formed or a substrate used for circuit formation.

Though the preferred embodiments of the present invention have been discussed above, the present invention is not limited to the above-discussed preferred embodiments but allows various variations.

The step for setting the order to pass through the divided regions may be executed independently from the division of the regions as discussed above, and any algorithm may be used as an algorithm for setting the passing order. Though the Hilbert Curve generation algorithm is used in the above preferred embodiments as the simplest example, other algorithm of generating a plane filling type fractal curve may be also used. For example, as the fractal curve generation algorithms, e.g., the Peano Curve (in a strict sense), the Sierpinski Curve or the like, may be used.

In Step S11 or S13, the region is not limitedly divided into four divided regions but also may be divided into more or less (for example, nine) divided regions. The shape of the divided region is not necessarily a rectangle. In other words, the region may be divided unequally, or may be divided into triangular divided regions. Even in the case where the region is divided into divided regions of other shape such as triangle, the fractal curve generation algorithm according to the shape of the divided regions may be used.

Though the division of the divided regions are recursively executed until the number of writing points 60 in each divided region become not more than the upper limit number in Steps S12 and S13, only if the divided region is substantially divided into smaller region as the density of the writing points 60 in the divided region is higher, other criterion of division may be adopted.

The operation flow of FIG. 4 may be changed as appropriate in a possible range. For example, a sectional path between the endpoints may be obtained after connecting the writing points which serve as the endpoints.

Though the passing order among the divided regions 61 which are first obtained is set in a loop, the passing order not in a loop may be adopted if there is no concept of the main scan and the subscan of the electron beam, unlike in the beam direct-writing apparatus 1. For example, in the imaging apparatus 1a of the second preferred embodiment, when the region 6 of FIG. 6 is a region to be inspected, if a region inspected in a preceding operation is positioned on the left side adjacently to the region 6 and a region to be inspected in a subsequent operation is positioned on the right side of the region 6, it is preferable that the conversion algorithm of FIG. 10A should be adopted on the four divided regions 61. This suppresses the transfer distance of the stage 3 in the imaging apparatus 1a in the transfer between regions.

While the invention has been shown and described in detail, the foregoing description is in all aspects illustrative and not restrictive. It is therefore understood that numerous modifications and variations can be devised without departing from the scope of the invention.

What is claimed is:

1. A beam direct-writing apparatus for performing beam direct-writing on a substrate, comprising:
   a beam emission part for emitting a direct-writing beam onto said substrate;
   a deflection part for deflecting said beam;
   a holding part for holding said substrate; and
   a path setting part for obtaining a path passing through a plurality of writing points on said substrate,
   wherein said path setting part executes:
      a region dividing step for dividing a two-dimensional writing region into a plurality of divided regions so that a divided region is smaller as density of writing points contained in said divided region is higher;
      a region passing order setting step for setting a region passing order which is an order for said path to pass through said plurality of divided regions;
      a writing point setting step for setting a first writing point and a second writing point for each of said plurality of divided regions on the basis of said region passing order;
      a sectional path setting step for obtaining a sectional path passing through points from said first writing point to said second writing point in each of said plurality of divided regions by using a predetermined path setting algorithm; and a sectional path connecting step for connecting said second writing point in each of said plurality of divided regions to said first writing point in the next divided region according to said region passing order.

2. The beam direct-writing apparatus according to claim 1, wherein said region dividing step comprises:

a simple division step for dividing said writing region into a predetermined number of divided regions which have almost the same size; and a recursive execution step for recursively executing said simple division step for one out of said predetermined number of divided regions which is selected on the basis of density of said plurality of writing points.

3. The beam direct-writing apparatus according to claim 2, wherein a region passing order among divided regions which are obtained in the first execution of said simple division step is determined in advance, region passing orders among divided regions which are obtained in the second and subsequent executions of said simple division step are determined in advance on the basis of passing manners of a divided region before division, and said region dividing step and said region passing order setting step are executed substantially at the same time.

4. The beam direct-writing apparatus according to claim 3, wherein said region passing orders among said divided regions which are obtained in the second and subsequent executions of said simple division step are determined in advance by using a fractal curve generation algorithm.

5. The beam direct-writing apparatus according to claim 4, wherein each of said plurality of divided regions has a rectangle shape, and said fractal curve generation algorithm is an algorithm for generating the Hilbert Curve.

6. The beam direct-writing apparatus according to claim 3, wherein said region passing order among said divided regions which are obtained in the first execution of said simple division step is in a loop.

7. The beam direct-writing apparatus according to claim 2, wherein said simple division step is recursively executed in said recursive execution step until the number of writing points in each divided region after division becomes not more than a predetermined number.

8. An imaging apparatus for performing an image pickup of a substrate, comprising:

a lighting part for emitting illumination light to said substrate;

an image pickup part for acquiring image data of said substrate;

a holding part for holding said substrate;

a transfer mechanism for transferring said image pickup part relatively to said holding part; and a path setting part for obtaining a path passing through a plurality of imaging positions on said substrate, wherein said path setting part executes:

a region dividing step for dividing a predetermined region on said substrate into a plurality of divided regions so that a divided region is smaller as density of imaging positions contained in said divided region is higher;

a region passing order setting step for setting a region passing order which is an order for said path to pass through said plurality of divided regions;

an imaging position setting step for setting a first imaging position and a second imaging position for each of said plurality of divided regions on the basis of said region passing order;

a sectional path setting step for obtaining a sectional path passing through said imaging positions from said first imaging position to said second imaging position in each of said plurality of divided regions by using a predetermined path setting algorithm; and a sectional path connecting step for connecting said second imaging position in each of said plurality of divided regions to said first imaging position in the next divided region according to said region passing order.

9. The imaging apparatus according to claim 8, wherein said region dividing step comprises:

a simple division step for dividing said predetermined region into a predetermined number of divided regions which have almost the same size; and a recursive execution step for recursively executing said simple division step for one out of said predetermined number of divided regions which is selected on the basis of density of said plurality of imaging positions.

10. The imaging apparatus according to claim 9, wherein a region passing order among divided regions which are obtained in the first execution of said simple division step is determined in advance, region passing orders among divided regions which are obtained in the second and subsequent executions of said simple division step are determined in advance on the basis of passing manners of a divided region before division, and said region dividing step and said region passing order setting step are executed substantially at the same time.

11. The imaging apparatus according to claim 10, wherein said region passing orders among said divided regions which are obtained in the second and subsequent executions of said simple division step are determined in advance by using a fractal curve generation algorithm.

12. The imaging apparatus according to claim 11, wherein each of said plurality of divided regions has a rectangle shape, and said fractal curve generation algorithm is an algorithm for generating the Hilbert Curve.

13. The imaging apparatus according to claim 10, wherein said region passing order among said divided regions which are obtained in the first execution of said simple division step is in a loop.

14. The imaging apparatus according to claim 9, wherein said simple division step is recursively executed in said recursive execution step until the number of imaging positions in each divided region after division becomes not more than a predetermined number.

15. A computer-readable medium carrying a program for obtaining a preferable path passing through a plurality of points in a two-dimensional region, wherein execution of said program by a computer causes said computer to perform:

a region dividing step for dividing a region into a plurality of divided regions so that a divided region is smaller as density of points contained in said divided region is higher;

a region passing order setting step for setting a region passing order which is an order for said path to pass through said plurality of divided regions;

a endpoint setting step for setting a first endpoint and a second endpoint for each of said plurality of divided regions on the basis of said region passing order;

a sectional path setting step for obtaining a sectional path passing through said points from said first endpoint to said second endpoint in each of said plurality of divided regions by using a predetermined path setting algorithm; and a sectional path connecting step for connecting said second endpoint in each of said plurality of divided regions to said first endpoint in the next divided region according to said region passing order.

16. The computer-readable medium according to claim 15, wherein said region dividing step comprises:

a simple division step for dividing said region into a predetermined number of divided regions which have almost the same size; and a recursive execution step for recursively executing said simple division step for one out of said predetermined number of divided regions which is selected on the basis of density of said plurality of points.

17. The computer-readable medium according to claim 16, wherein a region passing order among divided regions which are obtained in the first execution of said simple division step is determined in advance, region passing orders among divided regions which are obtained in the second and subsequent executions of said simple division step are determined in advance on the basis of passing manners of a divided region before division, and said region dividing step and said region passing order setting step are executed substantially at the same time.

18. The computer-readable medium according to claim 17, wherein said region passing orders among said divided regions which are obtained in the second and subsequent executions of said simple division step are determined in advance by using a fractal curve generation algorithm.

19. The computer-readable medium according to claim 18, wherein each of said plurality of divided regions has a rectangle shape, and said fractal curve generation algorithm is an algorithm for generating the Hilbert Curve.

20. The computer-readable medium according to claim 17, wherein said region passing order among said divided regions which are obtained in the first execution of said simple division step is in a loop.

21. The computer-readable medium according to claim 16, wherein said simple division step is recursively executed in said recursive execution step until the number of points in each divided region after division becomes not more than a predetermined number.

22. A method of obtaining a preferable path passing through a plurality of points in a two-dimensional region, comprising:

a region dividing step for dividing said region into a plurality of divided regions so that a divided region is smaller as density of points contained in said divided region is higher;

a region passing order setting step for setting a region passing order which is an order for said path to pass through said plurality of divided regions;

a endpoint setting step for setting a first endpoint and a second endpoint for each of said plurality of divided regions on the basis of said region passing order;

a sectional path setting step for obtaining a sectional path passing through said points from said first endpoint to said second endpoint in each of said plurality of divided regions by using a predetermined path setting algorithm; and a sectional path connecting step for connecting said second endpoint in each of said plurality of divided regions to said first endpoint in the next divided region according to said region passing order.

23. The method according to claim 22, wherein said region dividing step comprises:

a simple division step for dividing said region into a predetermined number of divided regions which have almost the same size; and a recursive execution step for recursively executing said simple division step for one out of said predetermined number of divided regions which is selected on the basis of density of said plurality of points.

24. The method according to claim 23, wherein a region passing order among divided regions which are obtained in the first execution of said simple division step is determined in advance, region passing orders among divided regions which are obtained in the second and subsequent executions of said simple division step are determined in advance on the basis of passing manners of a divided region before division, and said region dividing step and said region passing order setting step are executed substantially at the same time.

25. The method according to claim 24, wherein said region passing orders among said divided regions which are obtained in the second and subsequent executions of said simple division step are determined in advance by using a fractal curve generation algorithm.

26. The method according to claim 25, wherein each of said plurality of divided regions has a rectangle shape, and said fractal curve generation algorithm is an algorithm for generating the Hilbert Curve.

27. The method according to claim 24, wherein said region passing order among said divided regions which are obtained in the first execution of said simple division step is in a loop.

28. The method according to claim 23, wherein said simple division step is recursively executed in said recursive execution step until the number of points in each divided region after division becomes not more than a predetermined number.

* * * * *